United States Patent [19]

Li

[11] Patent Number: 5,036,281

[45] Date of Patent: Jul. 30, 1991

[54] RESIZING MRI IMAGES USING FOURIER TRANSFORMATION

[75] Inventor: Jianhua Li, S. San Francisco, Calif.

[73] Assignee: The Regents of the University of California, San Francisco, Calif.

[21] Appl. No.: 495,040

[22] Filed: Mar. 16, 1990

[51] Int. Cl.[5] ............................................. G01R 33/20
[52] U.S. Cl. ...................................... 324/309; 324/312
[58] Field of Search ............... 324/300, 307, 309, 312, 324/314, 318, 322; 128/653 A

[56] References Cited

U.S. PATENT DOCUMENTS

| | | | |
|---|---|---|---|
| 4,593,247 | 6/1986 | Glover | 324/307 |
| 4,644,280 | 2/1987 | Paltiel | 324/309 |
| 4,703,271 | 10/1987 | Loeffler et al. | 324/314 |
| 4,748,411 | 5/1988 | Holland | 324/312 |
| 4,789,933 | 12/1988 | Chen et al. | 324/312 |
| 4,891,595 | 1/1990 | Granot | 324/309 |
| 4,893,080 | 1/1990 | Luyten | 324/309 |

OTHER PUBLICATIONS

Bartholdi et al., "Fourier Spectroscopy and the Causality Principle," *Journal of Magnetic Resonance*, 9, (1973).
Parker et al., "Comparison of Interpolating Methods for Image Resampling," vol. MI-2, No. 2, *IEEE Transactions on Medical Imaging*, p. 31, (Mar. 1983).
Maeland, "On the Comparison of Interpolation Methods," vol. 7, No. 3, *IEEE Transactions on Medical Imaging*, p. 213, (Sep. 1988).
Mareci, "High-Resolution Magnetic Resonance Spectra from a Sensitive Region Defined with Pulsed Field Gradients," *Journal of Magnetic Resonance*, 57, pp. 157–163, (1984).

*Primary Examiner*—Michael J. Tokar
*Attorney, Agent, or Firm*—Nixon & Vanderhye

[57] ABSTRACT

MRI images are selectively resized or "zoomed" by zero padding the time domain data. Fourier Transformation of the time domain data after zero padding provides spatial domain data which when displayed provide an image that is resized relative to images provided from the time domain data without zero padding. A "zoom" or magnification factor can be selected and the quantity of padded zeros varied in response to the zoom factor to provide different zoom ratios. Restricting zoom factors to certain values permits the fast Fourier Transform to be used in Fourier Transformation.

21 Claims, 6 Drawing Sheets

RESIZING MRI IMAGES USING FOURIER TRANSFORMATION

FIELD OF THE INVENTION

This invention relates to nuclear magnetic resonance (NMR) and magnetic resonance imaging (MRI) and more particularly to MRI Fourier Transformation image reconstruction. More particularly, the present invention relates to techniques for "zooming in" or otherwise changing the size of MRI images using Fourier Transformation.

BACKGROUND AND SUMMARY OF THE INVENTION

It is often desirable to "zoom in" on or otherwise change the size of an MRI image (e.g., to provide more detailed views of structures of interest). Such "zooming" is not generally straight-forward or easy to accomplish, however, due to a correspondence between the number of time domain (raw data) samples within the time domain data set and the number of pixels defined by the spatial (image) domain data resulting from Fourier Transformation.

Figure 1:
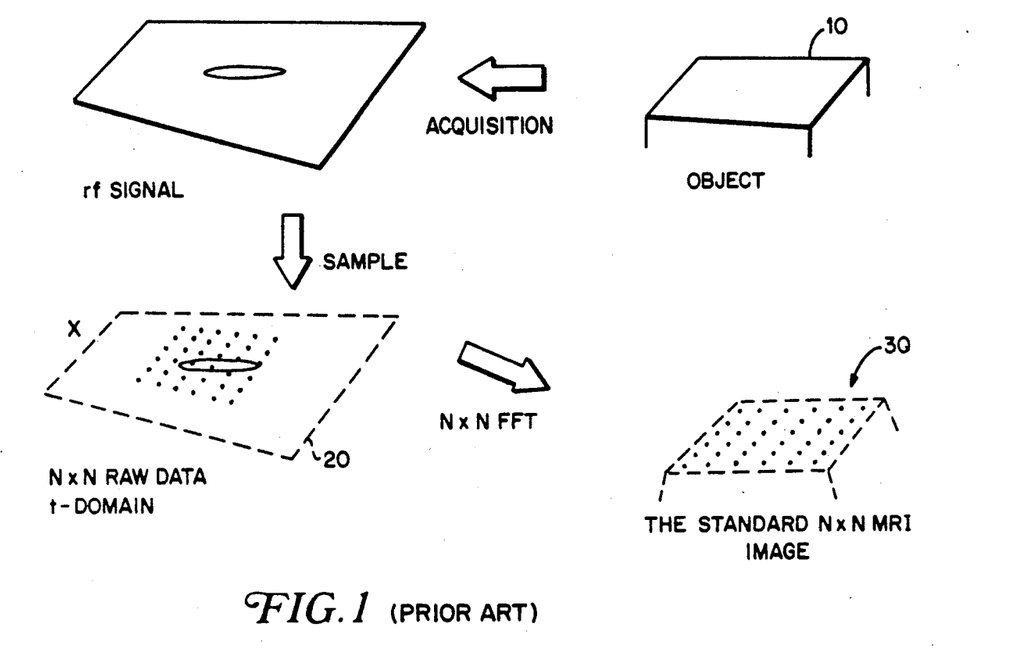
FIG. 1 is a schematic representation of prior art magnetic resonance imaging techniques.

The fundamentals of the MRI experiment are well known. Briefly (and hopefully without undue oversimplification), in a typical MRI system an object 10 (see FIG. 1) to be imaged (e.g., a portion of the human body) is placed in an external static magnetic field gradient. Protons within the object tend to align their spins in accordance with the magnetic field direction. The object is excited by one or more RF excitation pulses of appropriate frequency, timings and durations (as one example, so-called "spin-echo" type pulse sequences may be used). The RF excitation pulses generated at the Larmour frequency cause the protons to precess their spins. When each RF pulse is switched off, the nucleii precess back toward their equilibrium position and in this relaxation process emit an NMR response that can be detected by an RF receiver.

In most imaging applications the NMR responses are spatially encoded by applying different magnetic field gradients during excitation, readout and in between. For example, two-dimensional spatial encoding may be provided using the so-called "spin warp" technique in which frequency information within the NMR responses store spatial information in one dimension (e.g., the x direction), and the phase component of the NMR responses store spatial information in the other dimension (e.g., the z direction). Using this technique, a readout gradient (e.g., Gx) is switched on during readout to frequency encode the spatial information in the one dimension (e.g., x); and another gradient (e.g., Gz) is switched on during the so-called "evolution" period (between the excitation period and the readout period) to phase encode the NMR pulses in the other dimension (e.g., z). The amplitude or duration of the phase encoding gradient is typically changed during a scan to provide different variations in phase angle for each NMR signal detected.

During the readout period, the NMR signal is typically sampled at regular time intervals $\tau$ to provide a time domain raw data set of Fourier coefficients $S(t_0, \tau)$, $S(t_0, 2\tau)$, $S(t_0, 3\tau)$ ... $S(t_0, n\tau)$—the value of $\tau$ being chosen to conform to the sampling theorem (i.e., the sampling rate is at least twice the highest frequency component present in the signal). A sampling rate that is too low will generally result in a frequency interval that is too coarse—causing the object to fill only a small portion of the image field. Too high a sampling rate will result in aliasing the high frequency signals (thus folding them back into the low frequency part of the spectrum). The total number of sample points (Fourier coefficients) determines the spatial resolution after Fourier transformation (typically in two dimensions) and is usually chosen to be a power of 2 in order to take advantage of FFT (fast Fourier Transform) techniques. The resulting set of raw NMR time-domain data is generally symmetrical in both dimensions (e.g., x and z) and thus constitutes an N×N array of time-domain values.

The time domain data set may be further manipulated in a well known manner for a variety of reasons (e.g., to correct for instrumentation error, to improve signal-to-noise ratio, etc.)

The term "reconstruction" describes the process by which the acquired time-domain data set is converted into an image of the object. A two-dimensional Fourier transform (FT) is applied to the time-domain data set as described above to extract the frequency and phase information (and thus the spatial encoding) to develop spatial domain data (see FIG. 1). This spatial domain data may then be further processed using conventional techniques to provide an image on an electronic display and/or stored in a data file for later retrieval and imaging.

The sampling interval $\tau$ used during image acquisition generally establishes spatial resolution (i.e., the number of pixels) of the spatial domain data set—since sampling interval determines the spatial distribution corresponding to the Fourier coefficients and thus establishes the coordinate points of a "grid" of slice-volumes defined within the object space. Thus, in general it has been necessary to gather a 256×256 raw data array in order to provide a reconstructed image comprising 256×256 pixels. It was known in the past, however, to alter in a limited manner this essentially one-to-one correspondence between number of acquired time-domain samples and the number of values in the spatial domain.

For example, it is known to add zero values to the raw data set (a technique called "zero filling") in one or more dimensions to take advantage of the resulting improvement in image "resolution" (i.e., to increase the total number of pixels per line in images) without a concomitant increase in acquisition time. This technique involves adding zero "high frequency" components (i.e , zero values around the "outside" of the time domain data set array). This zero filling technique was also used to reduce acquisition time by increasing the signal-to-noise ratio of "high frequency" image components without degrading image "resolution" or computation time. See Batholdi et al, 11 *Journal of Magnetic Resonance* 9 (1973).

Many in the past have sought to provide "zooming" capability for MRI. The following is a non-exhaustive listing of prior issued U.S. Patents relating to advantages of and techniques for MRI image "zooming":

U.S. Pat. No. 4,703,271 to Loeffler et al;
U.S. Pat. No. 4,644,280 to Paltiel; and
U.S. Pat. No. 4,593,247 to Glover.

Many prior art zooming techniques provided altered RF pulse sequences and/or other acquisition parameters. For example, the Glover patent discloses a technique in which NMR signals are band-limited prior to conversion by the A/D converter so as to band limit the NMR signal in the X and Y axis directions. "Zooming"

in on off center regions is accomplished by shifting the receiver frequency. The technique disclosed in the Paltiel patent avoids aliasing artifacts to allow image zooming by using a pseudo spin echo sequence.

The technique of "interpolation" may also be used to accomplish "zooming." Interpolation permits values of the image at coordinate points different from those imposed by the sampling interval to be ascertained. Such image interpolation techniques are extremely useful in allowing greater flexibility in changing image appearance without requiring new data to be acquired. Interpolation may be used in conjunction with resampling to "zoom" in on an image (i.e., to provide an image in which there is more than one pixel for each time-slice imposed by the sampling interval). Unfortunately, interpolation techniques may sometimes add artifacts to the "zoomed in" image.

Interpolating an image generally involves fitting a continuous function to the discrete points in the digital image so that values are defined at coordinate points other than those predetermined by the sampling interval. The continuous function may then be resampled at arbitrary points of interest. Interpolation and sampling can be combined so that the signal is interpolated only at those points which will be sampled during the resampling process.

Figure 7A:
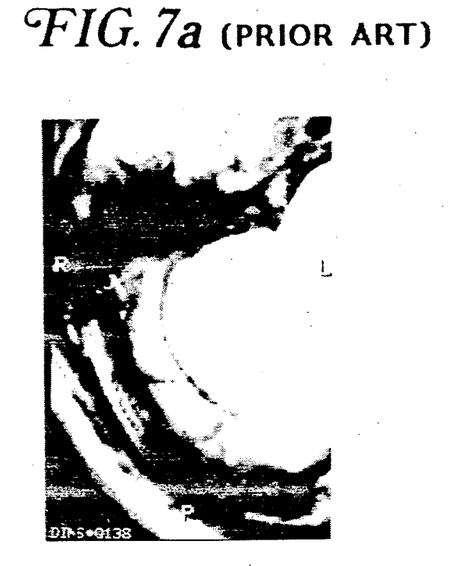
FIG. 7A is a photographic illustration of an actual resized MRI image provided by a prior art linear interpolation/resampling technique.

But interpolation and resampling can sometimes introduce troublesome artifacts that cause the zoomed image to lose clarity. For example, the assignee of the subject application has in the past provided zooming capability through a technique of linear interpolation of spatial domain (image) data followed by resampling the interpolated data so as to provide more pixel values than were provided by the sampling interval used during data acquisition. While this technique can provide a "zoomed in" image (i.e., an image that is enlarged in size with respect to the original image provided without interpolation), the interpolation/resampling process can introduce image artifacts (see FIG. 7A for example). Much work has been done in the past toward finding better interpolating functions to use in MRI. Parker et al in "Comparison of MI-2, No. 2, *IEEE Transactions on Medical Imaging* (March 1983) survey a variety of different interpolating functions and discuss the advantages and disadvantages of each. See also Maeland, "On the Comparison of Interpolation Methods", Vol. 7, No. 3 *IEEE Transactions on Medical Imaging* (Sept. 1988). While better interpolation techniques might possibly be used to reduce such artifacts, such better interpolation techniques may also introduce computational complexity requiring additional processing resources and/or longer processing time. More computationally-efficient yet flexible techniques for resizing MRI images would therefore be highly advantageous.

A different approach to interpolation is described in a commonly assigned now allowed patent application Ser. No. 07/293,859 of Kaufman et al filed 5 Jan. 1989 entitled "3D Image Reconstruction Method for Placing 3D Structure Within Common Oblique or Contoured Slice-Volume Without Loss of Volume Resolution". That commonly-assigned patent application discloses a Fourier Transformation image reconstruction interpolation technique in which the boundaries of a slice-volume can effectively be shaped in three dimensions. The Kaufman et al technique involves applying the Fourier Shift theorem to time-domain data during Fourier Transformation to result in pixel shifts in the spatial domain.

The present invention is directed to a further improvement in Fourier Transformation MRI image reconstruction techniques, and more specifically, provides an interpolation technique which changes the size of the MRI image that can be produced from a given time domain data set without suffering from the disadvantages which arise from interpolating and resampling spatial domain data.

In accordance with one aspect of this invention, a two-dimensional array of MRI "raw data" time domain data set (e.g., digitized NMR signals acquired by an analog-to-digital converter) is conceptually defined within a larger two-dimensional array in which all points within the larger array not defined by the time domain data set are set to a zero value (i.e., higher frequency components than those acquired by the sampling are defined and set to zero). The size of the larger array is selected to provide a desired "zoom factor." The larger array (including the "zero padded" values) are then processed using Fourier transformation techniques (e.g., Fourier transformation in two dimensions) to produce spatial domain data. The resulting spatial domain data defines an image which is resized with respect to an image produced if the original time domain data set had been processed in the normal manner using Fourier Transformation.

In accordance with one feature of the present invention, the "raw data" time domain data set generated during acquisition is Fourier Transformed without "zero padding" to produce spatial domain data. The spatial domain data may be displayed to provide an "original" image. The spatial domain data is stored, and the "raw data" time domain data set is discarded. If a magnified ("zoomed", "enlarged" or "blown up") view of a structure of interest within the "original" image is desired, the operator selects a zoom factor and initiates a zooming function. Spatial domain data is subjected to inverse Fourier Transformation (e.g., in two dimensions) to regenerate a time domain data set. The regenerated time domain data set is then "zero padded" and Fourier transformed (e.g., Fourier transformed in two dimensions with the limits of the Fourier Transformation being set to be larger than the actual extents of the time domain data set by an amount determined in response to the operator-selected "zoom factor") to provide new spatial domain data. The new spatial domain data resulting from the Fourier Transformation may then be displayed to provide an "enlarged" view—with the amount of magnification as compared with the "original" image depending upon the selected limits for the Fourier Transformation.

In accordance with another embodiment of the present invention, the original time domain data set provided by the analog-to-digital converter is not discarded after Fourier Transformation (as is the normal practice) but is instead stored for later use if magnification is required. If desired, the time domain data set may be processed using Fourier Transformation in the conventional manner for display; and the resulting spatial domain data and the time domain data set may both be stored. If display of the conventionally sized image is desired at a later time, that display may be generated from the spatial domain data. If, on the other hand the operator wishes to display a resized image, the zero padding/Fourier Transformation technique described above is applied to the stored time domain data set to produce a resized image.

A further aspect of the present invention involves selecting a zoom factor value (e.g., by an operator on an interactive basis) and calculating a size for the zero-padded time domain data array based on the selected zoom factor. The zoom factor value and resulting corresponding zero padded time domain array size may thus be varied at will (e.g., on an interactive basis) to provide different sized images.

A further aspect of the present invention relates to restricting zoom factor values so as to minimize computation time. In accordance with this further feature of the present invention, only certain zoom factors are preferably used so as to permit use of the fast Fourier Transform (FFT). Assume that the size of the larger "zero padded" array is $M \times M$ where M is an integer. If $M = 2^n$ (i.e., M is a power of 2), it is possible to use FFT to process the zero padded time domain data set. However, being restricted to M being a power of 2 may be somewhat inflexible for some applications since it limits the number of different zoom factors that may be used. In accordance with a further aspect of this invention, certain additional integer values for M may also permit use of FFT. For example, M may be in the form of $M = 2^p 3^q$; $M = 2^p 5^q$; or $M = 2^p 3^q 5^r$ where p, q (and r) are each integers. Each of these forms for M also permits use of FFT for fourier transformation of the zero padded time domain data set—thus providing additional flexibility in selecting zoom factors while nevertheless also providing the increase in computational efficiency offered by FFT.

These and other features and advantages of the present invention will be better and more completely understood by referring to the following detailed description of presently preferred exemplary embodiments in conjunction with the appended sheets of drawings, of which.

DETAILED DESCRIPTION OF PRESENTLY PREFERRED EXEMPLARY EMBODIMENTS

Figure 2:
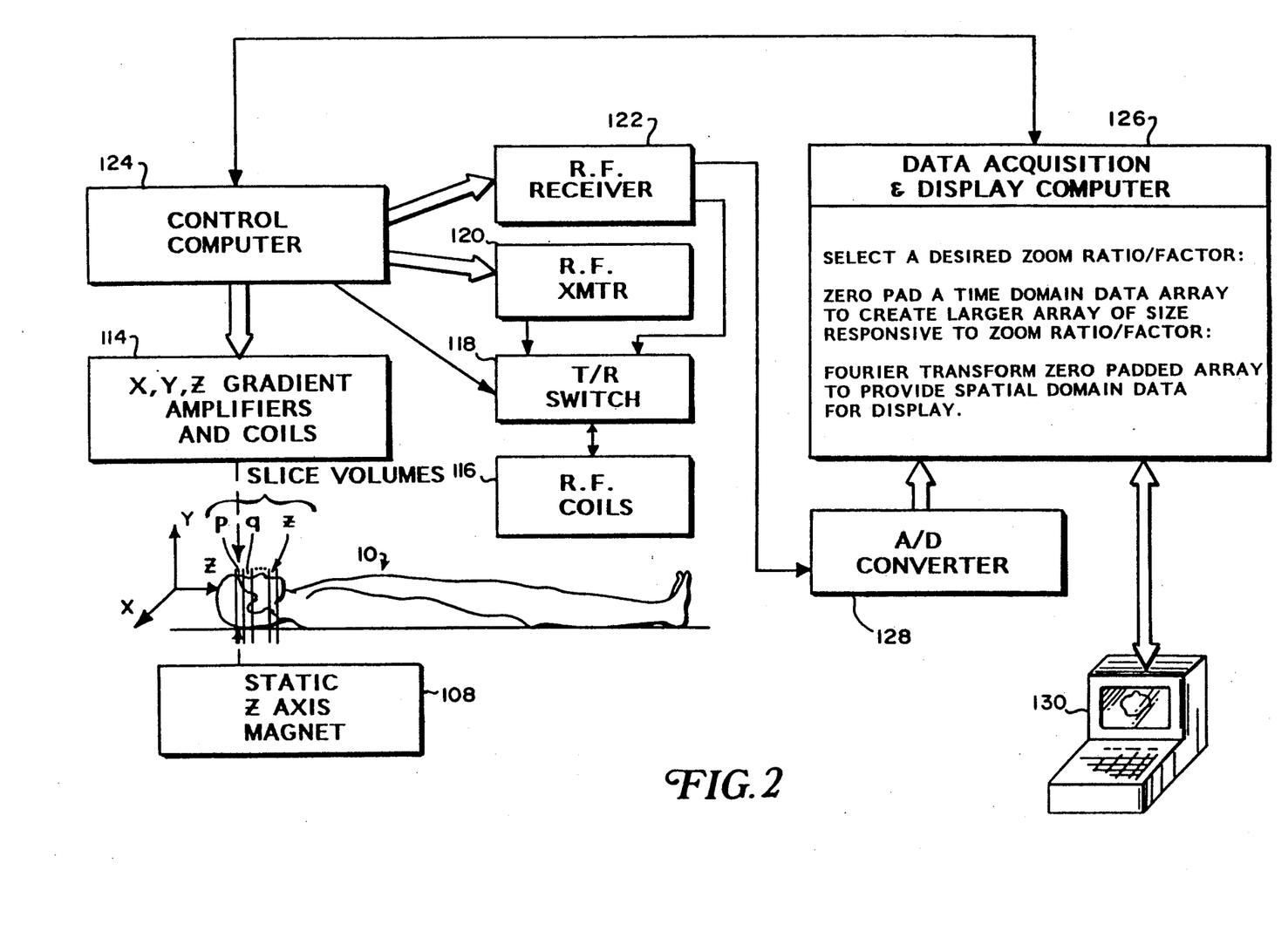
FIG. 2 is a schematic block diagram of a presently preferred exemplary embodiment of a magnetic resonance imaging system in accordance with the present invention.

The novel image resizing procedure utilized by this invention typically can be achieved by suitable alteration of stored controlling computer programs in an existing MRI type apparatus. The block diagram of FIG. 2 depicts the general architecture of an example of such a system.

Typically, a human or animal subject (or any other object to be imaged) 10 is placed within a static magnetic field. For example, the subject may lie along the z-axis of a static magnet 108 which establishes a substantially uniform magnetic field directed along the z-axis within the portion of the object 10 of interest. For example, contiguous parallel slice-volumes p,q . . . z may be located within the volume to be imaged. Gradients (e.g., a fixed weak z gradient) may be imposed within this z-axis directed magnetic field along mutually orthogonal x,y,z axes by a set of x,y,z gradient amplifiers and coils 114 to phase encode the resulting NMR response signals which are generally then read out with the gradients turned off. NMR RF signals are transmitted into the object 10 and NMR RF responses are received from the object via RF coils 116 connected by a conventional transmit/receive switch 118 to an RF transmitter 120 and RF receiver 122. As will be appreciated by those in the art, separate transmit and receive coils may be used in some installations in which case the T/R switch 118 may not be needed.

All of the prior mentioned elements may be controlled, for example, by a control computer 124 which communicates with a data acquisition and display computer 126. The latter computer 126 may also receive NMR responses via an analog-to digital converter 128. A CRT display and keyboard unit 130 is typically also associated with the data acquisition and display computer 126.

As will be apparent to those in the art, such an arrangement may be utilized so as to generate desired sequences of magnetic gradient pulses and NMR RF pulses and to measure the desired NMR RF responses in accordance with stored computer programs. As depicted in FIG. 2, the NMR system of this invention will typically include RAM, ROM and/or other stored program media adapted (in accordance with the descriptions herein) to select a desired zoom ratio or factor, zero pad a time domain data array (the zero padded array size being responsive to the selected zoom ratio/factor), and Fourier Transform the zero padded array to provide spatial domain data for display purposes.

Figure 3:
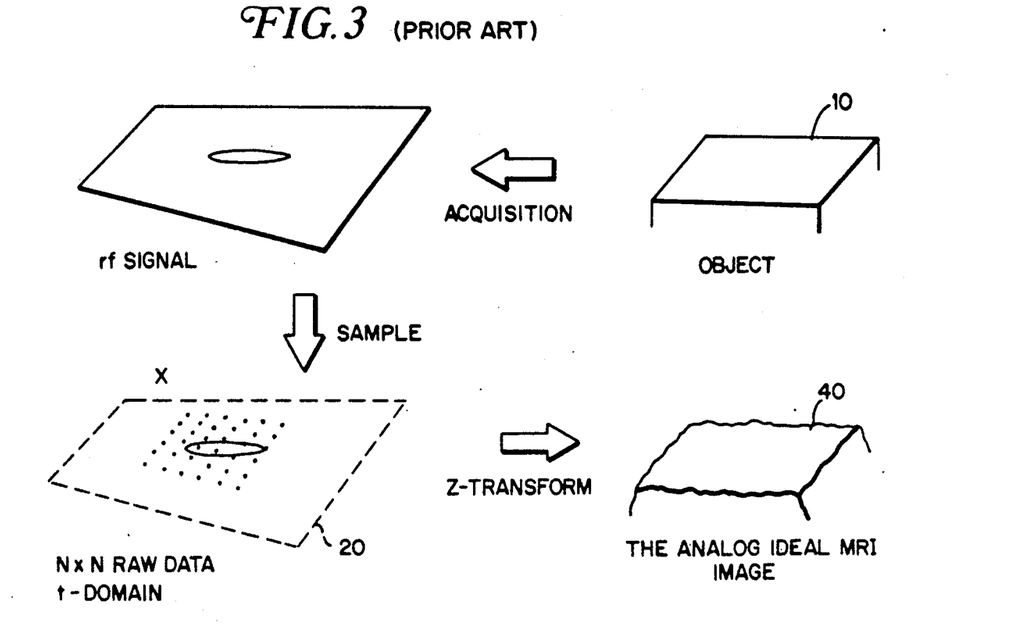
FIG. 3 is a schematic illustration of a prior art technique for using the z-transform to produce an analog ideal MRI image.

Referring to FIG. 3, assume that NMR responses are elicited from object 10 by the FIG. 2 NMR system and that these responses are digitized to provide an $N \times N$ "raw data" time domain array 20. Thus, this time domain ("raw") data set 20 comprises:

$$x: x(m,n), m,n = -N/2, \ldots, 0, \ldots (N/2) - 1 \quad (1-1)$$

where N is an even number, say:

$$(\text{e.g., } N = 256). \quad (1-2)$$

The two-dimensional z-transform of x is:

$$X(z_1, z_2) = \sum_{m=-N/2}^{N/2-1} \sum_{n=-N/2}^{N/2-1} x(m,n) z_1^{-m} z_2^{-n}. \quad (1-3)$$

The frequency spectrum of x is:

$$X(e^{-j\omega}, e^{-j\theta}) = \sum_{m=-N/2}^{N/2-1} \sum_{n=-N/2}^{N/2-1} x(m,n) e^{-j\omega m} e^{-j\theta n}, \quad (1-4)$$

for $0 \leq \omega, \theta \leq 2\pi$.

The frequency spectrum of x given in expression (1-4) is the ideal MRI image of the object obtained from the raw data (shown schematically in FIG. 3 at 40).

The z-transform is typically not used during standard reconstruction; rather, a two-dimensional Fourier transform of x (see FIG. 1) is calculated as follows to provide "standard" MRI image data:

$$X(k,l) = \sum_{m=-N/2}^{N/2-1} \sum_{n=-N/2}^{N/2-1} x(m,n) e^{-j2\pi mk/N} e^{-j2\pi nl/N}, \quad (2\text{-}1)$$

for $k,l = 0, \ldots, N-1$.

By comparing (1-4) with (2-1), we have that:

$$X(k,l) = X(e^{-j\omega}, e^{-j\theta})|_{\omega=2\pi k/N, \theta=2\pi l/N}, \text{ for } k,l = 0, \ldots, N-1.$$

This means that the standard discrete MRI image is the $N \times N$ point sampling of the ideal analog MRI image with zero offset and a sampling rate of $1/N$.

The concept of "zooming" or "resizing" will now be introduced. For an even integer M, $M > N$, let Y be the data set of the $M \times M$ point sampling of the ideal analog MRI image 40 (see FIG. 3) with zero offset and a sampling rate of $1/M$ (in other words, for example, assume that the ideal analog MRI image is itself sampled at a sampling interval such that an $M \times M$ array of distributed equally spaced spatial domain sampled values are obtained). That is:

$$\overline{Y}(k,l) = X(e^{-j\omega}, e^{-j\theta})|_{\omega=2\pi k/M, \theta=2\pi l/M}, \quad (3\text{-}1)$$

for $k,l = 0, \ldots, M-1$.

The $M \times M$ point sampling of the ideal analog MRI image described in expression (3-1) above is said to be "zoomed" or "resized" with respect to the standard MRI image 30 (see FIG. 1) with zero offset and a "zoom factor" of $$r = M/N. \quad (3\text{-}2)$$

Now, for an even integer $M > N$, consider the $M \times M$ array of time domain values:

$$y: y(m,n) = x(m,n) \text{ if} \quad (4\text{-}1)$$

Figure 5:
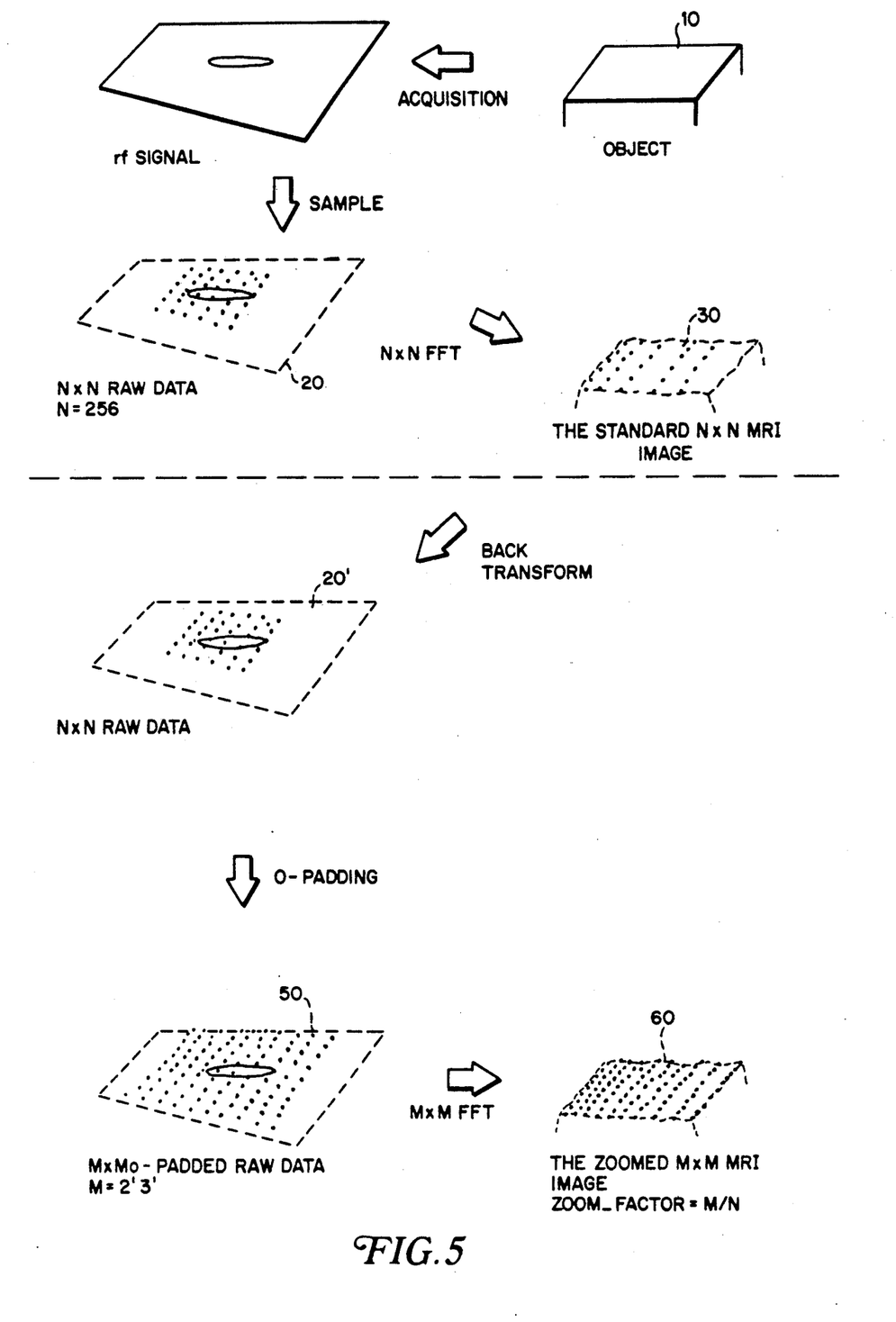

$-N/2 + 1 \leq m,n \leq N/2-1$ and $y(m,n) = 0$ else.

obtained by centering the $N \times N$ array 20 within a larger $M \times M$ array and zero padding all points in the larger array not defined by values from the smaller array. FIG. 5 shows such a zero-padded time domain array obtained by centering the $N \times N$ array 20 within the $M \times M$ array and zero-padding the so-called "high frequency component" (i.e., outside) values within the $M \times M$ array.

The two-dimensional Fourier transform of new time domain data set Y is:

$$Y(k,l) = \sum_{m=-M/2}^{M/2-1} \sum_{n=-M/2}^{M/2-1} y(m,n) e^{-j2\pi mk/M} e^{-j2\pi nl/M}, \quad (4\text{-}2)$$

for $k,l = 0, \ldots, M-1$.

By comparing expression (4-2) with expression (3-1) we determine that:

$$Y(k,l) = \sum_{m=-N/2}^{N/2-1} \sum_{n=-N/2}^{N/2-1} x(m,n) e^{-j2\pi mk/M} e^{-j2\pi nl/M} \quad (4\text{-}3)$$

$$= X(e^{-j\omega}, e^{-j\theta})|_{\omega=2\pi k/M, \theta=2\pi l/M} = \overline{Y}(k,l),$$

for $k,l = 0, \ldots, M-1$.

That is, it is possible to provide zoomed image data in the spatial domain by zero padding in the time domain (using a zoom factor set as a rational number given in expression (3-2)) and then transforming the time domain data to spatial domain data using Fourier Transformation.

Expressions (3-2) and (4-2) are general—that is, they apply for any integer value of M. However, it may be desirable to replace the general Fourier transformation described in expression (4-2) with fast Fourier Transform (FFT) to increase computational efficiency and decrease processing time.

When M is restricted to certain integer values, FFT can be used in lieu of slower, more general Fourier Transformation techniques. FFT can be used whenever M is a power of 2 (i.e., $M = 2^n$, n an integer). However, since M must generally be greater than N and N is typically on the order of 128 or 256 in many standard MRI commercial systems, it can be seen that restricting M to being a power of 2 may restrict the operator from obtaining desired zoom factors. For example, the following possibilities set forth in Table I below are provided assuming N=256:

TABLE I

| Padded Array Size | Zoom Factor |
|---|---|
| $M = 512 = 2^8$ | $r = 2$ |
| $M = 1024 = 2^9$ | $r = 4$ |
| $M = 2048 = 2^{10}$ | $r = 8$ |
| $M = 4096 = 2^{11}$ | $r = 16$ |

Typically it is impractical to use any value of r exceeding about 10 or so because of limitations relating to the resolution of the display device. For example, standard CRTs may have resolutions of only on the order of $512 \times 512$ pixels, and associated digital frame buffers likewise have limited resolution. While it is possible to produce spatial domain data defining an image area larger than the area which may be displayed on a standard electronic display at one time, it is possible to "window" the display (that is, position the "area" covered by the display as desired within a larger image space defined by the spatial domain data). Nevertheless, practical considerations in terms of memory resources (and also limited image resolution— since no interpolation technique can add information about the object not contained within the initial acquired time domain data set) limited useful "zoom" ratios to less than about 10:1. Thus, the possibilities described above for applying FFT are relatively limited.

However, FFT may also be used when M is calculated by multiplying an integer power of 2 with an integer power of 3. Consider for example $$M = 2^p 3^q \quad (5\text{-}1)$$

where p and q are integers. FFT can be easily applied using M values defined in accordance with this expression. Assuming N=256, the following Table II below lists all of the possible zoom factors R, $1 < R < 3$ and the corresponding subset of even integer values for M:

TABLE II

| Padded Array Size | Zoom Factor |
|---|---|
| $M = 288 = 2^5 3^2$ | $R = 1.125 \approx 1.1$ |
| $M = 324 = 2^2 3^4$ | $R = 1.267 \approx 1.3$ |
| $M = 384 = 2^7 3^1$ | $R = 1.5$ |
| $M = 432 = 2^4 3^3$ | $R = 1.688 \approx 1.7$ |
| $M = 486 = 2^1 3^5$ | $R = 1.899 \approx 1.9$ |
| $M = 512 = 2^9 3^0$ | $R = 2$ |
| $M = 576 = 2^6 3^2$ | $R = 2.25 \approx 2.3$ |
| $M = 648 = 2^3 3^4$ | $R = 2.53 \approx 2.5$ |
| $M = 729 = 2^0 3^6$ | $R = 2.85 \approx 2.9$ |
| $M = 648 = 2^8 3^1$ | $R = 3$ |

If other zoom factors are needed, M may be defined in accordance with the expressions:

$$M = 2^p 5^q \quad (5\text{-}2)$$

or $$M = 2^p 3^q 5^r \quad (5\text{-}3)$$

where p, q and r are all integers.

It is possible to use FFT even for M×M arrays in which M does not correspond to one of the "special values" discussed above by dividing the M×M array into smaller arrays of appropriate size. For example, given a zero padded M×M array, M having an arbitrary value, one can find within the array the largest possible array of size $2^n$ and perform FFT on that array; perform FFT on the next largest sized $2^n$ array, etc.

The present invention is not limited to "zooming" in only two dimensions. If the time domain data set is defined in three dimensions (as it often is) it may also be desirable to zoom in the direction of the magnetic gradient. Typically, however, there are a relatively small number of time domain samples taken along this direction (e.g., 32 or 64) so that applying the conventional "slow" Fourier Transform to zero padded data along this dimension presents no significant computational problems.

Figure 4:
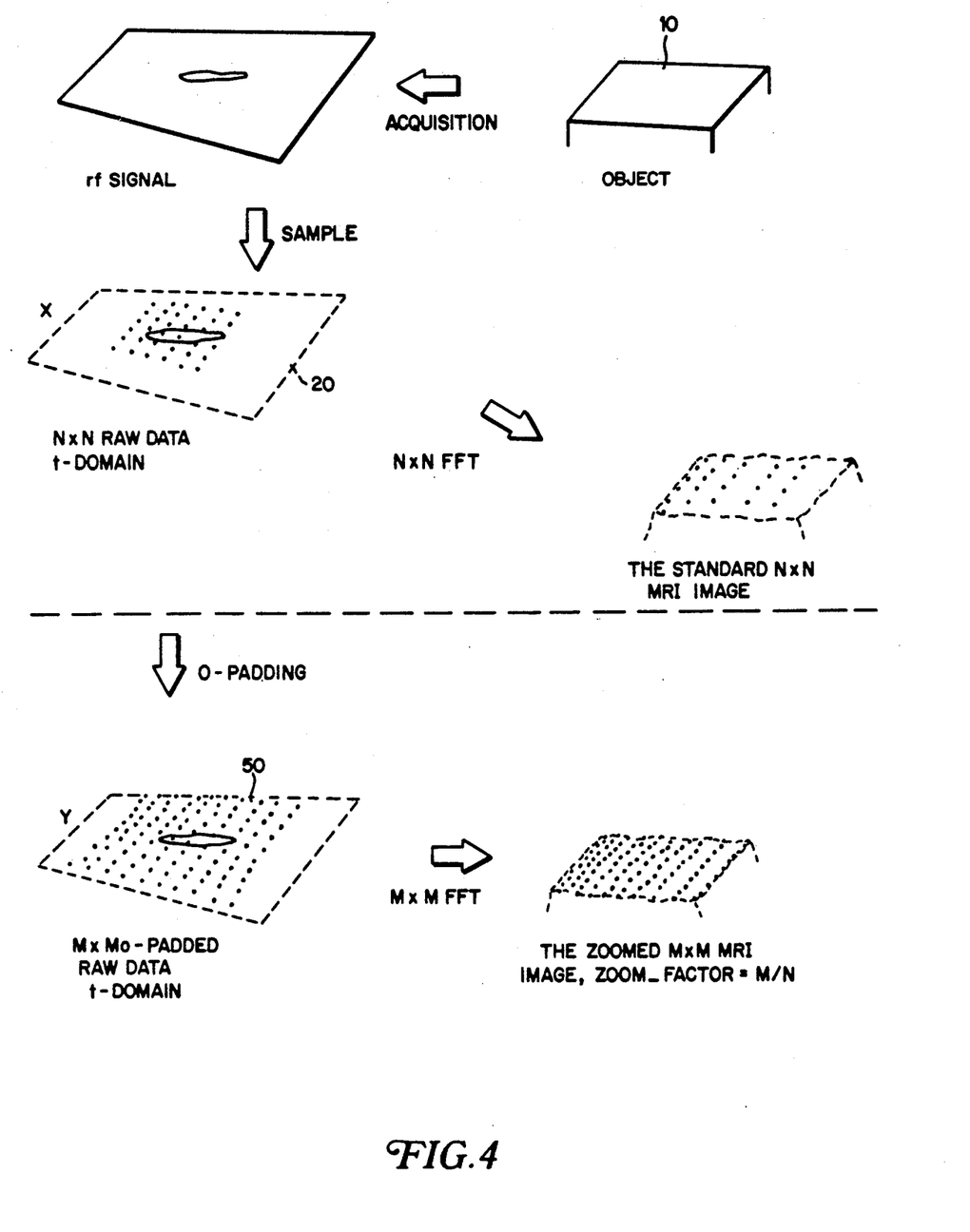
FIGS. 4-5 are schematic illustrations of exemplary alternate techniques for operating the FIG. 2 MRI system to provide resized images.

FIG. 4 shows the overall process performed by the FIG. 2 NMR system in accordance with one preferred embodiment of the present invention, while FIG. 5 shows the overall process performed by the NMR system in accordance with a further embodiment of this invention. In both the FIG. 4 and the FIG. 5 embodiment, the FIG. 2 system generates an N×N time-domain data set 20 from object 10 and Fourier transforms that time domain data set 20 into spatial domain data 30 for imaging—all in a conventional manner.

In instances where "zooming" is required, the FIG. 4 embodiment zero pads the original time domain data set 20 provided by the analog to digital conversion process (typically after the data set has been further processed to correct for instrumentation errors and possibly averaged to improve S/N) to provide a padded M×M time domain data set 50. This padded data set 50 then undergoes Fourier Transformation (preferably using FFT as described above) to provide further spatial domain data 60 for display. The image generated from the further spatial domain data 60 is enlarged with respect to the image generated from the standard spatial domain data 30 by a magnification factor depending upon the quantity of rows/columns of zero values used to pad the N×N time domain data 20 so as to provide the padded time domain data set 50.

Image analysis often occurs sometime after data acquisition. In many systems, the time domain data set 20 is discarded after the spatial domain data 30 is produced since it is no longer needed and only a spatial domain data file is written to mass storage. In the FIG. 4 embodiment, however, the time domain data set is saved to mass storage in addition to (or instead of) the spatial domain data to permit later performing the image resizing process described herein.

In the FIG. 5 embodiment, the time domain data set 20 is discarded (in a conventional manner) once spatial domain data 30 has been produced If image resizing is required, a pseudo-time domain data set 20' is generated by "back transforming" (using inverse Fourier Transformation techniques) the spatial domain data 30. The pseudo-time domain data set 20' is then zero padded as desired to provide a padded time domain data set 50 and this padded time domain data set then transformed to provide resized spatial domain data 60. If several different zoom factors are desired, the back transformation need only be performed once and the resulting pseudo-time domain data set 20' then padded by different quantities of rows/columns of zero values to provide several different padded data sets 50 which may then each be Fourier Transformed (thus providing several different sets of resized spatial data 60).

Figure 6:
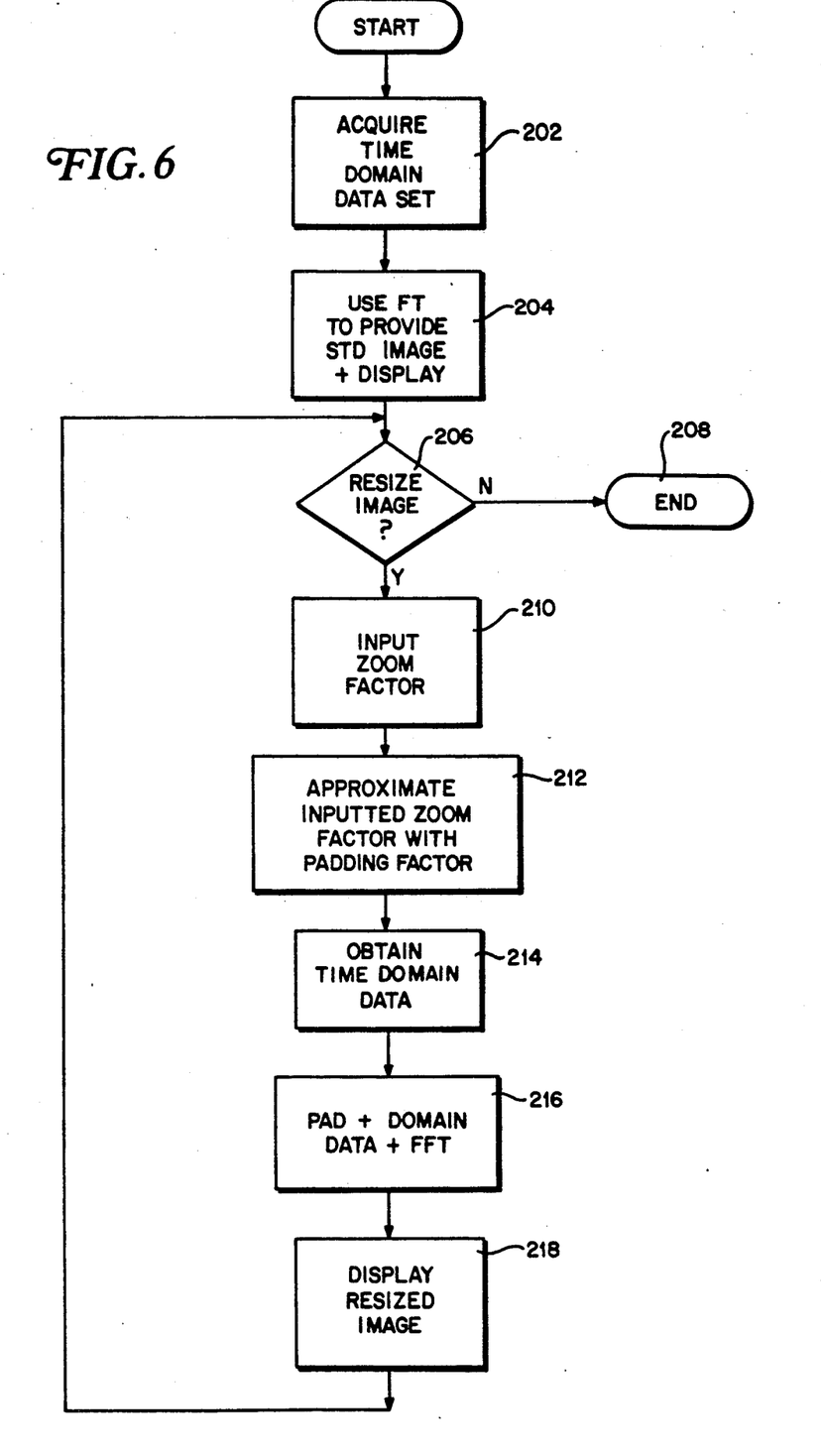
FIG. 6 is a flowchart of exemplary program control steps performed by the FIG. 2 system to provide resized images.

FIG. 6 is a flowchart of exemplary program control steps performed by the FIG. 2 system in accordance with this invention. In the preferred embodiment, the time domain data set 20 is acquired in the normal manner by FIG. 2 components 108, 114–128 (block 202) and data acquisition and display computer 126 performs conventional FT techniques to generate spatial domain data and provide a standard image for display on display device 30 (block 204). If no image resizing is required, the imaging process in complete (decision block 206; block 208). On the other hand, the steps of blocks 210–218 are performed if image resizing is desired (as invoked by decision block 206).

When image resizing is desired, the operator is asked to input a desired "zoom factor" or "zoom ratio" r (block 210). In the preferred embodiment, this zoom factor/ratio is typically expressed as the desired size of the new image with respect to the size of the standard image displayed by block 204 (e.g., 1.5 to 1 magnification, 2 to 1 magnification, etc.) If FFT techniques are to be used, data acquisition and display computer 126 generates a value M>N (where N is the extent of the time domain data set to be operated upon) by calculating a an M value, M=r*N, and then approximating this calculated M value with an "acceptable" M value entry within a prestored entry corresponding to for example Table I or Table II above (block 212). Alternatively, input block 210 may restrict the operator to selecting a zoom factor r corresponding to an "acceptable" M value by presenting the operator with a limited list of choices from which he may choose.

Once a value of M (in effect, a "padding factor" which represents the quantity of rows/columns of zero values that must be used to "pad" the time domain data set) has been determined, the time domain data set to be padded is obtained (e.g., by retrieval from mass storage in the FIG. 4 embodiment or by back transforming in the FIG. 5 embodiment; block 214) and padded with an appropriate number of rows/columns of zero values to provide a padded time domain data set (block 216). The padded time domain data set is then transformed (using FFT in this embodiment) to provide resized spatial domain data (block 216) which is then displayed. In the preferred embodiment, FFT is performed using a hardware-based special purpose fast Fourier Transformation processor of conventional design which performs FFT on one row or column of the time domain data set 20 at a time. This FFT processor accepts as inputs (a) a row or column of data values, and (b) a length parameter specifying the limits over which FFT is to be performed. To zero pad in the preferred embodiment, a length in excess of the number of row or column data values is specified—causing the processor to effectively "zero pad" the values with an equal number of leading and trailing zeros prior to transformation.

Of course, block 204 need not necessarily produce an unzoomed image having 1:1 magnification. In some applications (e.g., where the number of pixels on the display is greater than the number of samples in the time domain data set), it may be desirable to provide a certain zoom factor as a default—so that the image is normally zoomed by a certain factor (e.g., 1.8 for 256 time domain data set samples and a 512-pixel electronic display). Such default zooming can be provided, for example, by zero padding with a fixed number of zeros before Fourier Transformation (possibly in conjunction with further interpolation/resampling as will be discussed below). In such a system, the zoom factor inputted at block 210 would then be a user-specified variable zoom factor different from the "default" zoom factor.

Figure 7B:
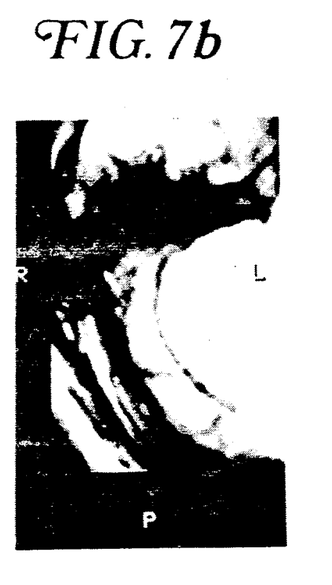
FIG. 7B is a photographic illustration of an actual resized MRI image provided by the presently preferred exemplary embodiment of the present invention.

Still further flexibility in terms of zoom factor selection is provided in the preferred embodiment by using the zero padding/Fourier transformation technique described above in conjunction with conventional linear interpolation/resampling techniques. For example, suppose a magnification factor of 1.8 is desired. In the preferred embodiment, the raw data time domain data set is zero padded and fast Fourier Transformed to provide a magnification factor of two (2); and the resulting spatial domain data is then "shrunk" by a factor of 0.9 using conventional linear interpolation techniques to provide a final image having a magnification factor of 1.8 (an actual image produced by such a process is shown in FIG. 7(b)). Since the linear interpolation/resampling provides a zoom factor of less than 1 (in this example), the artifacts it introduces into the final image are relatively insignificant (more information is present in the spatial domain data than is incorporated into the interpolated/resampled data—so information is actually being discarded by the linear interpolation process). As is well known, linear interpolation/resampling can provide "zoom factors" corresponding to any rational number.

Thus, in accordance with this further aspect of the present invention, the zero padding/Fourier Transformation technique is used to provide a "coarse" zoom function by generating spatial domain data that is then operated upon by a linear interpolation/resampling process which provides a "fine zoom"—with the zero padding technique preferably providing a larger zoom factor than is actually desired and the linear interpolation process being applied to "shrink" the image that would otherwise result from zero padding/Fourier Transformation.

An MRI image resizing technique has been described which operates on the time domain data set so that after FT a resized image results. This technique is computationally very efficient and eliminates artifact problems that sometimes arise when interpolation/resampling of the spatial domain data is used for image resizing (compare FIG. 7A, an image resized to a zoom factor of 1.8 using spatial domain data interpolation/resampling, with FIG. 7B, an image resized to the same 1.8 magnification using zero padding/FFT followed by linear interpolation as described herein).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. In a nuclear magnetic resonance imaging system of the type which acquires a time domain data set representing NMR responses and transforms said time domain data set to spatial domain data for imaging purposes, an improved image resizing method including the following steps:
   (a) specifying a desired zoom factor;
   (b) zero padding said time domain data set, including the step of selecting the quantity of padded zeros in response to said zoom factor; and
   (c) Fourier transforming said zero padded time domain data set in at least one dimension so as to generate spatial domain data corresponding to said specified zoom factor.

2. In a nuclear magnetic resonance imaging system of the type including an RF pulse generator and a magnetic field generator which elicit NMR responses from an object to be imaged, an acquisition/conversion circuit which receives such NMR responses and provides a digitized time domain data set in response thereto, and a processor which applies a Fourier Transform in at least one dimension to said time domain data set so as to generate spatial domain data and develops an image responsive to said spatial domain data for display on an electronic display, a method of resizing said image including the following steps:
   (a) selecting a variable zoom factor;
   (b) determining a quantity of zero values in response to said selected variable zoom factor; and
   (c) processing said time domain data set and said selected quantity of additional zero values with said Fourier Transform to provide said spatial domain data.

3. A method as in claim 2 wherein:
   said time domain data set defines an array of size $N \times N$; and
   said determining step (b) includes the steps of:
   selecting a value $M > N$, M being a power of two,
   defining said time domain data set $N \times N$ array within an $M \times M$ array,
   setting to zero all entries within said $M \times M$ array not occupied by an entry of said $N \times N$ array, and
   applying fast Fourier Transform techniques to said $M \times M$ array so as to produce spatial domain data.

4. A method as in claim 2 wherein:
   said time domain data set defines an array of size $N \times N$; and
   said determining step (b) includes the steps of:
   selecting a value $M > N$ from a subset of even integer values,
   defining said time domain data set $N \times N$ array within an $M \times M$ array,
   setting to zero all entries within said $M \times M$ array not occupied by an entry of said $N \times N$ array, and applying fast Fourier Transform techniques to said M×M array so as to produce spatial domain data.

5. A method as in claim 2 wherein:
said time domain data set defines an array of size N×N; and
said determining step (b) includes the steps of:
  selecting a value M>N, M being any even integer values,
  defining said time domain data set N×N array within an M×M array,
  setting to zero all entries within said M×M array not occupied by an entry of said N×N array, and
  applying slow Fourier Transform techniques to said M×M array so as to produce spatial domain data.

6. In a nuclear magnetic resonance imaging apparatus of the type including means for generating RF pulses, means for generating a magnetic field, data acquisition means for receiving NMR responses elicited by said RF pulse generating means and said magnetic field generating means and for providing a digitized time domain data set in response to said NMR responses, processing means coupled to said acquisition means for applying a Fourier Transform in at least one dimension to said time domain data set so as to generate spatial domain data, and electronic display means for developing an image in response to said spatial domain data, a method of resizing said image including the following steps:
  (a) selecting a variable zoom factor;
  (b) defining said time domain data set within a larger time domain data set including said time domain data and additional zero values;
  (c) selecting the size of said larger time domain data set in response to said selected variable zoom factor; and
  (d) applying said Fourier Transform to said larger time domain data set so as to provide said spatial domain data.

7. A method as in claim 6 wherein: said time domain data set defines an array of size N×N;
  said larger data set size selecting step (c) includes the steps of:
    selecting a value M>N, M being a power of two,
    defining said time domain data set N×N array within an M×M array, and
    setting to zero all entries within said M×M array not occupied by an entry of said N×N array; and
  said applying step (d) comprises applying the fast Fourier Transform (FFT) to said M×M array so as to produce spatial domain data.

8. A method as in claim 6 wherein:
said time domain data set defines an array of size N×N; and
said larger time domain data set size selecting step (c) includes the steps of:
  selecting a value M>N from a subset of even integer values,
  defining said time domain data set N×N array within an M×M array, and
  setting to zero all entries within said M×M array not occupied by an entry of said N×N array; and
said applying step (d) comprises applying the fast Fourier Transform to said M×M array so as to produce spatial domain data.

9. A method as in claim 6 wherein:
said time domain data set defines an array of size N×N; and
said size selecting step (c) includes the steps of:
  selecting a value M>N, M being any even integer values,
  defining said time domain data set N×N array within an M×M array, and
  setting to zero all entries within said M×M array not occupied by an entry of said N×N array.

10. In a nuclear magnetic resonance imaging system of the type including an RF pulse generator and a magnetic field generator which elicit NMR responses from an object to be imaged, an acquisition circuit which receives such NMR responses and provides a digitized time domain data set in response thereto, and a reconstruction processor, a method for developing an image for display on an electronic display including the following steps:
  (a) applying Fourier Transformation to said time domain data set so as to produce first spatial domain data;
  (b) developing a first image from said first spatial domain data;
  (c) retaining said time domain data set; and
  (d) conditioning performance of the following steps upon operator request to generate a resized image:
    (i) zero padding said time domain data set and applying Fourier Transformation to said zero padded time domain data set so as to produce second spatial domain data, and
    (ii) developing an image resized with respect to said first image from said second spatial domain data.

11. A method as in claim 10 wherein:
said time domain data set defines an array of size N×N;
said zero padding step (i) includes the steps of:
  selecting a value M>N, M being a power of two,
  defining said time domain data set N×N array within an M×M array, and
  setting to zero all entries within said M×M array not occupied by an entry of said N×N array; and
said image developing step (ii) comprises applying fast Fourier Transform techniques to said M×M array so as to produce spatial domain data.

12. A method as in claim 10 wherein:
said time domain data set defines an array of size N×N;
said zero padding step (i) includes the steps of:
  selecting a value M>N from a subset of even integer values,
  defining said time domain data set N×N array within an M×M array,
  setting to zero all entries within said M×M array not occupied by an entry of said N×N array; and
  said image developing step (ii) comprises applying fast Fourier Transform techniques to said M×M array so as to produce spatial domain data.

13. A method as in claim 10 wherein:
said time domain data set defines an array of size N×N;
said zero padding step (i) includes the steps of:
said determining step (b) includes the steps of:
  selecting a value M>N, M being any even integer value, defining said time domain data set N×N array within an M×M array, and setting to zero all entries within said M×M array not occupied by an entry of said N×N array; and said image developing step (d) comprises applying slow Fourier Transform techniques to said M×M array so as to produce spatial domain data.

14. In a nuclear magnetic resonance imaging system of the type including an RF pulse generator and a magnetic field generator which elicit NMR responses from an object to be imaged, an acquisition circuit which receives such NMR responses and provides a digitized time domain data set in response thereto, and a reconstruction processor, a method for developing an image for display on an electronic display including the following steps:

(a) applying Fourier Transformation to said time domain data set so as to produce first spatial domain data;

(b) discarding said time domain data set;

(c) developing a first image from said first spatial domain data; and (d) conditioning performance of the following steps upon operator request to generate a resized image:

(i) back Fourier transforming said first spatial domain data to provide a regenerated pseudo time domain data set, (ii) zero padding said regenerated time domain data set and applying Fourier Transformation to said zero padded time domain data set so as to produce second spatial domain data, and (iii) developing an image resized with respect to said first image from said second spatial domain data.

15. A method as in claim 14 wherein:

said pseudo time domain data set defines an array of size N×N;

said zero padding step (ii) includes the steps of:

selecting a value M>N, M being a power of two, defining said time domain data set N×N array within an M×M array, and setting to zero all entries within said M×M array not occupied by an entry of said N×N array; and said image developing step (ii) comprises applying fast Fourier Transform techniques to said M×M array so as to produce spatial domain data.

16. A method as in claim 14 wherein:

said pseudo time domain data set defines an array of size N×N;

said zero padding step (ii) includes the steps of:

selecting a value M>N from a subset of even integer values, defining said time domain data set N>N array within an M×M array, setting to zero all entries within said M×M array not occupied by an entry of said N×N array; and said image developing step (iii) comprises applying fast Fourier Transform techniques to said M×M array so as to produce spatial domain data.

17. A method as in claim 14 wherein:

said pseudo time domain data set defines an array of size N×N;

said zero padding step (ii) includes the steps of:

said determining step (b) includes the steps of:

selecting a value M>N, M being any even integer value, defining said time domain data set N×N array within an M×M array, and setting to zero all entries within said M×M array not occupied by an entry of said N×N array; and said image developing step (iii) comprises applying slow Fourier Transform techniques to said M×M array so as to produce spatial domain data.

18. In a nuclear magnetic resonance imaging system of the type which acquires a time domain data set representing NMR responses and transforms said time domain data set to spatial domain data for imaging purposes, an improved image resizing method including the following steps:

(a) specifying a desired zoom factor;

(b) zero padding said time domain data set, including the step of selecting the quantity of padded zeros in response to said zoom factor;

(c) Fourier transforming said zero padded time domain data set in at least one dimension so as to generate first spatial domain data; and (d) applying interpolation and resampling techniques to said first spatial domain data so as to produce further spatial domain data corresponding to said zoom factor.

19. A method as in claim 18 wherein said applying step (d) includes the step of producing said further spatial domain data having a reduced number of data points relative to said first spatial domain data.

20. A method as in claim 18 wherein:

the zoom factor corresponding to said first spatial data is larger than said selected zoom factor and said applying step (d) effectively shrinks the size of an image represented by said first spatial domain data.

21. In a nuclear magnetic resonance imaging system of the type which acquires a time domain data set representing NMR responses and transforms said time domain data set to spatial domain data for imaging purposes, improved image resizing apparatus including:

means for specifying a desired zoom factor;

means operatively coupled to said specifying means for zero padding said time domain data set, including means for specifying the quantity of padded zeros in response to said zoom factor; and Fourier transforming means connected to receive said zero padded time domain data set for Fourier Transforming said zero padded time domain data set in at least one dimension so as to generate spatial domain data having a corresponding zoom factor no smaller than said specified zoom factor.

* * * * *

UNITED STATES PATENT AND TRADEMARK OFFICE
CERTIFICATE OF CORRECTION

PATENT NO. : 5,036,281
DATED : July 30, 1991
INVENTOR(S) : Jianhua Li

It is certified that error appears in the above-identified patent and that said Letters Patent is hereby corrected as shown below:

Column 14, claim 13, delete line 5, and col. 16, claim 17, line 8, both of which read:

"said determining step (b) includes the steps of:"

Signed and Sealed this

Fourteenth Day of September, 1993

Attest:

BRUCE LEHMAN

Attesting Officer

Commissioner of Patents and Trademarks